United States Patent
Yasuda et al.

(10) Patent No.: US 7,955,411 B2
(45) Date of Patent: Jun. 7, 2011

(54) LOW TEMPERATURE BONDING MATERIAL COMPRISING METAL PARTICLES AND BONDING METHOD

(75) Inventors: Yusuke Yasuda, Hitachi (JP); Toshiaki Morita, Hitachi (JP); Eiichi Ide, Hitachi (JP); Hiroshi Hozoji, Hitachiota (JP); Toshiaki Ishii, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 373 days.

(21) Appl. No.: 11/964,827

(22) Filed: Dec. 27, 2007

(65) Prior Publication Data

US 2008/0173398 A1  Jul. 24, 2008

(30) Foreign Application Priority Data

Dec. 28, 2006  (JP) .................................. 2006-353649

(51) Int. Cl.
  B32B 5/16 (2006.01)
  B22F 1/02 (2006.01)
(52) U.S. Cl. .............. 75/228; 75/247; 75/255; 428/403; 428/543; 428/548; 428/570
(58) Field of Classification Search .................. 428/403, 428/543, 548, 570; 75/228, 247, 255
  See application file for complete search history.

(56) References Cited

U.S. PATENT DOCUMENTS

| | | | | |
|---|---|---|---|---|
| 3,362,817 A * | 1/1968 | Galy et al. | .................... | 420/422 |
| 4,622,073 A * | 11/1986 | Hashizume | .................... | 106/403 |
| 7,150,920 B2 * | 12/2006 | Kodas et al. | .................... | 428/570 |
| 7,468,401 B2 * | 12/2008 | Ferencz | .................... | 523/171 |
| 2001/0049979 A1 * | 12/2001 | Zeller et al. | .................... | 75/255 |
| 2006/0022326 A1 | 2/2006 | Morita et al. | | |
| 2006/0267218 A1 | 11/2006 | Hozoji et al. | | |
| 2007/0193409 A2 * | 8/2007 | He et al. | .................... | 75/255 |
| 2007/0216012 A1 | 9/2007 | Hozoji et al. | | |
| 2007/0298244 A1 * | 12/2007 | Yasuda et al. | .................... | 428/328 |
| 2008/0156398 A1 * | 7/2008 | Yasuda et al. | .................... | 148/23 |

FOREIGN PATENT DOCUMENTS

| | | |
|---|---|---|
| JP | 2004-107728 | 4/2004 |
| JP | 2005-136375 | 5/2005 |
| WO | WO 2005/037465 A1 | 4/2005 |
| WO | WO 2005/075132 A1 | 8/2005 |

OTHER PUBLICATIONS

Machine translation of JP 2004-107728, Apr. 2004.*
Allen et al., Gateway Reactions to Diverse, Polyfunctional Monolayer-Protected Gold Clusters, J. Am. Chem. Soc. 1998, 120, 4845-4849.*

* cited by examiner

Primary Examiner — H. (Holly) T Le
(74) Attorney, Agent, or Firm — Antonelli, Terry, Stout & Kraus, LLP.

(57) ABSTRACT

A bonding material comprising metal particles coated with an organic substance having carbon atoms of 2 to 8, wherein the metal particles comprises first portion of 100 nm or less, and a second portion larger than 100 nm but not larger than 100 μm, each of the portions having at least peak of a particle distribution, based on a volumetric base. The disclosure is further concerned with a bonding method using the bonding material.

22 Claims, 7 Drawing Sheets

LOW TEMPERATURE BONDING MATERIAL COMPRISING METAL PARTICLES AND BONDING METHOD

CLAIM OF PRIORITY

The present application claims priority from Japanese application serial No. 2006-353649, file on Dec. 28, 2006, the content of which is hereby incorporated by reference into this application.

FIELD OF THE INVENTION

The present invention relates to a low temperature bonding material for bonding electronic parts and a method for bonding the electronic parts using the bonding material.

RELATED ART

In non-insulated type semiconductor devices such as power semiconductor devices that are used for inverters, etc, a member for fixing the semiconductor tips is an electrode through which electric current of several amperes or more flows heat at the time the semiconductor device is in operation so that the semiconductor chip generates. Recently, since a current capacity of the semiconductor device is increasing, an amount of heat at the mounting portion of the semiconductor device, i.e. die-bonding portion is increasing.

In order to stably operate the semiconductor chip while avoiding reduction in life and instability of characteristics due to the heat, it is necessary to secure heat dissipation at soldered portions and long-term reliability (heat resistance) of the semiconductor chip mounting portions. Accordingly, a bonding material which is excellent in high heat dissipation and heat resistance is needed.

On the other hand, in insulated type semiconductor devices it is necessary to effectively dissipate heat generating at the time of operation of the semiconductor devices to outside thereof and to secure bonding reliability of the soldered portions.

Patent document No. 1 discloses a bonding method wherein metal particles coated with organic substance and having a particle size of 100 nm or less is used, and the organic substance covering the metal particles is decomposed at the time of heating and pressurizing to thereby effect sintering phenomenon among the metal particles. In this technology, the metal particles after bonding transform into bulk metal and at the same time metallic bonding in the bonding interface of bonding takes place.

Patent document No. 2 discloses that in a bonding method using metal particles having a particle size of 100 nm or less, the metal particles having the particle size of 100 nm or less is mixed with particles having a particle size of 1 to 100 μm thereby to secure a thickness of the bonding layer.

Nowadays a change from solder material containing lead to lead-free solder has been urged; however, substituents for high temperature solder have not been provided so far. Since it is necessary to utilize hierarchy solders to perform package of electronic parts, a bonding material for substituents of the high temperature solder has been desired. Accordingly, the bonding technology utilizing the metal particles having the particle size of 100 nm or less is expected to be substituents for the high temperature solders.

Patent document No. 1: Japanese patent laid-open 2004-107728

Patent document No. 2: Japanese patent laid-open 2005-136375

SUMMARY OF THE INVENTION

The present invention is featured by a bonding material comprising metal particles coated with an organic, wherein the metal particles comprises (1) particles having a particle size of 100 nm or less and (2) metal particles having a particle size larger than 100 nm but not larger than 100 μm, and wherein there is at least one peak in each of particle distributions of the metal particles (1) and (2) in a volumetric unit.

A bonding material according to another aspect of the present invention comprises metal particles having a particle size of 1 nm to 100 nm and aggregates of the metal particles, wherein aggregates have a grain size of 10 nm to 100 μm.

A still another aspect of the present invention is featured by a method of bonding electrodes of an electronic part and winding circuits of a wiring board, which comprises coating a bonding material comprising metal particles coated with an organic substance and having a particle size of 100 μm, wherein the metal particles comprises (1) particles having a particle size of 100 nm or less and (2) metal particles having a particle size more than 100 nm to 100 μm, and wherein there is at least one peak in each of particle distributions of the metal particles (1) and (2) in a volumetric unit on a bonding face between the circuits and the electrodes, and heating and pressurizing the circuits, electrodes and the bonding material to thereby bond the circuits and the electrodes.

BRIEF DESCRIPTION OF THE DRAWINGS

FIG. 9 shows an embodiment of a non-insulated type semiconductor device similar to that of example 3 in which

DETAILED DESCRIPTION OF THE PREFERRED EMBODIMENTS

In the bonding technologies disclosed in Patent document Nos. 1 and 2, which use metal particles having a particle size of 100 nm or less, bonding at the bonding interface is performed by metallic bonding. As a result, high heat resistance, reliability and high heat dissipation are expected. On the other hand, the fine metal particles having a particle size of 100 nm or less tend to aggregate. Therefore, it is necessary to coat the metal particles with an organic material to stabilize the fine metal particles. In the conventional technologies, in order to stabilize the metal particles more stable organic materials such as alkylcarboxylic acid having a long chain have been used as a coating material. The protecting coating of the organic material must be removed at the time of bonding; however, the protecting coating is not removed completely by low temperature heating, which leads to insufficient shear strength. Accordingly, in order to obtain sufficient share strength the heating temperature is elevated or the heating time must be extended. However, it is necessary to lower the temperature for heat treatment and shorten the heating time so as to avoid damage to the electronic parts during the bonding process. In the bonding process using the metal particles having a particle size of 100 nm or less, low temperature and short time bonding have not been investigated.

The present invention aims at providing a bonding material and a bonding method that are capable of lowering the heating temperature and shortening the heating time during the bonding process, and also providing a semiconductor package free from deterioration of long term reliability under a high temperature atmosphere.

In the following the embodiments of the present invention will be explained in detail.

The present invention utilizes a phenomenon that sintering of fine metal particles having a particle size of 100 nm or less takes place. The bonding material of the present invention comprises metal particles having a particle size of 100 nm or less, the particles being coated with organic substance having carbon atoms of 2 to 8, wherein there are a first particle group of 100 nm or less and a second particle of 100 nm to 100 μm each having at least one peak of a particle size distribution based on volumetric unit.

Figure 1:
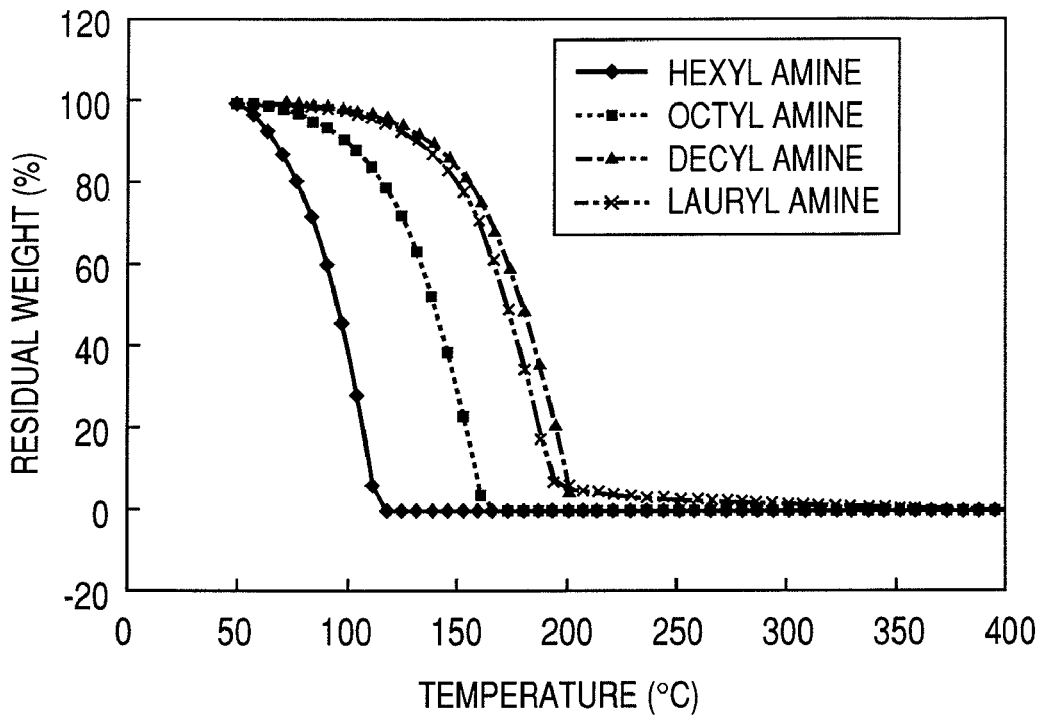
FIG. 1 shows a relationship between heating temperatures and residual weight.

In the present invention, the organic substance for coating the metal particles has carbon atoms of 2 to 8. FIG. 1 shows a relationship between heating temperatures and residual weight according to thermal weight measurement with respect to organic substances including hexyl amine having 6 carbon atoms, octyl amine having 8 carbon atoms, decyl amine having 10 carbon atoms, laulyl amine having 12 carbon atoms. According to FIG. 1, it is apparent that the smaller the number of carbon atoms of the organic substances, the lower the thermal weight loss starting temperature becomes. Accordingly, it is possible to lower the decomposition temperature for decomposition by using the organic substance having a short chain of the small number of carbon atoms. Therefore, by coating the metal particles with the organic substances having 2 to 8 carbon atoms, the decomposition and removal of the organic substance can be done at lower temperatures. That is, the bonding temperature can be lowered.

If the number of carbon atoms of the organic substance is smaller than 2, the metal particles aggregate at room temperature; the metal particles are not coated in a stable state. If the number of carbon atoms exceeds 8, the decomposition temperature is too high, and sintering of the metal particles is suppressed at the bonding process to thereby lower the shear strength. Accordingly, the number of carbon atoms in the organic substance is 2 to 8.

Since the organic substance for coating the metal particles becomes a component that suppresses sintering of the metal particles after the bonding, it is necessary to make an amount of residue of the organic substance in the bonding layer as small as possible. Therefore, it is necessary to make the amount of organic substance as small as possible so as to sufficiently decompose and remove it under low temperature.

The present inventors have found that after investigation on the metal particles coated with the organic substance containing carbon atoms of 2 to 8, the metal particles comprise not only particles having a particle size of 100 nm or less (first particles) but also particles having 100 nm to 100 μm (second particles), wherein the first and second particles have particle size distributions based on volumetric unit each having at least one peak. The metal particles having the particle size of 100 nm to 100 μm should preferably be coated with the organic substance because dispersing capability of the metal particles having the particle size of 100 nm to 100 μm with the metal particles having the particle size of 100 nm or less is better than the case where the metal particles having the particle size of 100 nm to 100 μm that is not coated with the organic substance is admixed with the metal particles having the particle size of 100 nm or less.

The metal particles having the particle size of 100 nm to 100 μm can be particles that are aggregated metal particles having the particle size of 100 nm or less. In this case, because the organic substance coated on the metal particles having the particle size of 100 nm or less and the coated metal particles having the particle size of 100 nm to 100 μm is the same one, a better dispersing capability in an organic solvent is expected.

Shapes of the aggregates of the metal particles may have different shapes such as globular, elliptic, triangle, rectangular forms, etc, which are formed by random unification of metal particles. The shapes of the aggregates are not limited to the above ones. The aggregates of metal particles having the particle size of 1 nm to 100 nm should preferably have a particle size of 10 nm to 100 μm.

As described above, by employing metal particles having peaks in the range of a particle size of 100 nm or less and a range of a particle size larger than 100 nm, a shear strength can be increased. Although the detailed mechanism for increasing the shear strength is not elucidated yet, it is considered that the metal particles of 100 nm or less fill gaps among metal particles of 100 nm or more in the bonding material to effect sintering at low temperatures thereby to enhance sintering of the metal particles of a particle size of 100 nm or more. Further, a combination of the metal particles having a peak in a range of 100 nm or less and a peak in a range of 100 nm or more reduces an amount of the organic substance in the bonding material, which leads to better sintering of the bonding material to reduce a residue of the organic substance. As a result, a high shear strength is obtained.

A mixing ratio (% by weight) of the metal particles of 100 nm or less to the metal particles of 100 nm or more is preferably more than 0.1% by weight, but less than 100%. If the amount of the metal particles of 100 nm or less is 0.1% or less, the gaps among the metal particles of 10 nm or more would not be filled with the metal particles of 10 nm or less. As a result, the shear strength will be lowered.

The metal particles used in the present invention and having a particle size of 100 nm or less are selected from the group of gold, silver, copper, platinum, palladium, rhodium, osmium, ruthenium, iridium, iron, tin, zinc, cobalt, nickel, chromium, titanium, tantalum, indium, silicon, aluminum, etc or alloys thereof. Particularly, Au or Au alloys, Ag or Ag alloys are preferably used singly or combinations thereof.

The metal particles having a particle size of 1 to 100 μm are selected from Au, Au alloys, Ag, Ag alloys, nickel metal core metal plated with Au or Au alloys, Ag or Ag alloys, or copper core metal plated with Au, Au alloys, Ag, Ag alloys, etc.

The organic substance having carbon atoms of 2 to 8 for coating the metal particles contains radicals that are capable of forming coordination with the metal elements and include oxygen atoms, nitrogen atoms or sulfur atoms. For example, there are exemplified an amino group, alcohol group, carboxylic group, sulfanyl group, carbonyl group, aldehyde group, etc.

Alkyl amines are useful compounds. For example, there are butyl amine, pentyl amine, hexyl amine, heptyl amine and octyl amine. The amine compounds may have a branched structure; for example, there are 2-ethylhexyl amine, 1,5-dimethylhexyl amine, etc. In addition to primary amines, secondary amines and tertiary amines are usable. The organic substance may have a cyclic structure.

Carboxylic compounds such as alkyl carboxylic acids are useful compounds. For example, there are butanoic acid, pentanoic acid, hexanoic acid, heptanoic acid and octanoic acid. In addition to the primary carboxylic acids, secondary carboxylic acids and tertiary carboxylic acids, dicarboxylic acids, cyclic carboxylic acids are usable.

Alcohol group containing compounds such as alkyl alcohols are usable. For example, there are ethanol, propyl alcohol, pentyl alcohol, heptyl alcohol and octyl alcohol. In addition to the primary alcohols, secondary alcohols, tertiary alcohols, alkane diols, cyclic alcohols are usable. Further, citric acid, ascorbic acid are usable.

Sulfanyl group containing compounds such as alkylthiols are useful compounds. For example, there are 1-thylthiol, 1-propyl thiol, 1-butylthiol, 1-pentylthiol, 1-hexylthiol, 1-heptylthiol and 1-ocylthiol. Secondary thiols and tertiary thiols may be used.

In addition to the above compounds, compounds containing carbonyl group, aldehyde group and ester group and having carbon atoms of 2 to 8 can be used as a protecting film. The compounds can be used singly or in combination.

The bonding material according to the present invention may be used in a form of paste wherein the metal particles coated with the organic substance are dispersed in an organic solvent. Examples of the organic solvents are alcohols such as methanol, ethanol, octyl alcohol, ethylene glycol, triethylene glycol, α-terpineol, etc, and hexane, heptane, octane, decane, dodecane, cyclopentane, cyclohexane, benzene, toluene, xylene, ethylbenzene, water, etc.

The bonding materials comprising the metal particles having the particle size of 100 nm or less, wherein the metal particles having the particle size of 100 nm or less and the metal particles having the particle size larger than 100 nm to 100 μm respectively have peaks in a volumetric base is prepared by aggregating the metal particles having the particle size of 100 nm or less. The metal particles having the particle size of 100 nm or less can be prepared by any conventional methods in which the metal particles having the particle size are synthesized in a solution. The metal particles coated with the organic substance and having the particle size of 100 nm or less, produced in the methods, subjected to removing a solvent with an evaporator. As a result, aggregation of the metal particles takes place to thereby form the bonding material comprising the metal particles of 100 nm or less and metal particles larger than 100 nm to 100 μm, the metal particles having peaks in the volumetric base.

In order to aggregate the metal particles having the particle size of 100 nm or less to impart a particle size distribution, the metal particles coated with the organic substance having carbon atoms of 2 to 8 can be heated, the organic substance is removed with an organic solvent, or ultraviolet ray is irradiated on the metal particles to vaporize the organic substance, in addition to the above mentioned-method. The method for aggregation of the metal particles are not limited to the above.

The bonding material can be admixed with flake form silver metal and a thermosetting resin such as epoxy resin, polyimide resin, etc. The resins are not limited to the above ones. In order to obtain strong bonding by the bonding material, an amount of the metal particles should preferably be larger than 50 parts by weight, but lower than 99 parts by weight, based on the total weight of the bonding material.

Next, a bonding method using the bonding material of the present invention will be explained.

In a method of bonding electrodes with circuit wiring of a wiring board, the above-described bonding material was coated at bonding faces of the circuit wiring and electrodes, and electronic elements were mounted on the circuit wiring. Followed by heating and pressuring the bonding faces to perform bonding.

A heating temperature was preferably 40° to 400° C. The heating temperature of 40° C. or higher was necessary to remove the organic substance coated on the metal particles within a reasonable time period. A pressuring time was 60 minutes or less. If the pressure time is longer than 60 minutes, it takes too much time to produce a product, which is not proper for mass production.

When the bonding material is used as a paste material for brazing, there are various methods exemplified below.

(1) An ink-jet method wherein the paste is coated on the bonding portion or the electrodes on a substrate by jetting the paste through a fine nozzle.
(2) A method for coating the paste through a metal mask or mesh-form mask, having a necessary opening.
(3) A method of coating the paste using a dispenser.
(4) A method of coating the water repellent resin through an opening of a metal mask or a mesh-form mask.
(5) A method of coating a photosensitive resin on a surface including the bonding portion, followed by exposing and developing the bonding portion. Then, the exposed portion is coated with the paste.
(6) A method of coating a water repellent resin on the surface including the bonding portion of a substrate or the electronic elements, followed by removing the water repellent resin on an unnecessary part to form openings. Then, the paste is coated in the openings.

The coating method is selected in accordance with area to be bonded and shapes of the bonding portions.

In the following, examples according to the present invention will be explained.

Examples 1-2, Comparative Examples 1-2

In example 1 Ag particles were coated with hexyl amine; in example 2 Ag particles were coated with octyl amine; in comparative example 1 Ag particles were coated with decyl amine; and in comparative example 2 Ag particles were coated with lauryl amine.

The Ag particles coated with hexyl amine in example 1 has peaks of particle size at 7.6 nm and 15.2 nm in a range of 100 nm or less, and a peak of particle size at 0.3437 μm in a range of 100 nm or more. The Ag particles coated with octyl amine in example 2 has peaks of particle size at 7.6 nm and 15.2 nm in a range of 100 nm or less, and a peak of particle size at 2.75 μm in a range of 100 nm or more.

The Ag particles coated with decyl amine in comparative example 1 has peaks of particle size at 7.6 nm and 15.2 nm in a range of 100 nm or less. The Ag particles coated with lauryl amine in comparative example 2 has a peak of particle size at 18.1 nm.

The above-mentioned 4 kinds of Ag particles were subjected to particle distribution measurement by dispersing the Ag particles in toluene. The particle distribution measurement was conducted by a micro-track ultra fine particle distribution meter 9340-UPA150 manufactured by Nikkiso, Ltd. Measurement was repeated three times and an average value was determined.

On the other hand, thermogravimetric analysis on 4 kinds of organic substances for coating the Ag particles, i.e. hexyl amine, octyl amine, decyl amine and lauryl amine was conducted. For measurement of the thermogravimetry, TG/DTA6200 manufactured by Seiko Instruments was used. A temperature rise was 10° C./min and measurement was carried out in air.

As shown in FIG. 1, hexyl amine having 6 carbon atoms in example 1 and octyl amine having 8 carbon atoms in example 2 exhibited lower thermogravimetric decrease temperatures than those of decyl amine having 10 carbon atoms in comparative example 1 and lauryl amine having 12 carbon atoms in comparative example 2. From these results, the smaller the number of carbon atoms of the organic substance, the lower the sintering temperature of the metal powder becomes.

The Ag particles coated with hexyl amine in example 1 having a particle size of 100 μm was prepared by dispersing Ag particles in 200 mL of toluene solvent together with 4.0 g of silver nitrate and 5 g of hexyl amine and the solution was stirred. Then, 4 g of ascorbic acid was added, followed by stirring for 1 hour and a half to thereby prepare Ag particles having a particle size of 100 nm or less and coated with hexyl amine. Thereafter, filteration of the solution was conducted using quantitative filter paper (No. 5) to remove unreacted ascorbic acid and silver nitrate.

Further, added was about 200 mL of acetone solvent to the toluene solution of the filtered product of silver particles whose surface was coated with hexyl amine and has a particle size of 100 nm or less so as to precipitate the silver particles. After removing the supernatant, purification was conducted by removing excess hexyl amine and by-products produced at the reaction. These processes were repeated three times. The repetition of the processes removes the organic substance covering silver particles and aggregation of the silver particles of the particle size of 100 nm or less proceeds to produce silver particles having a particle size of 100 nm or more.

As the number of carbon atoms of the organic substance covering the surface of the silver particles decreases, a distance among the silver particles becomes small so that silver particles may directly contact with each other. Further, because the low carbon atom organic substances have low volatile temperatures, and because the low carbon atom organic substance may separate from the silver particles, the silver particles tend to aggregate more easily than high carbon atom organic substances.

After evaporating the organic solvent of the resulting silver particles with an evaporator having 40° C. water bath, 2.5 g of silver particles was obtained. It is possible to effect aggregation of silver particles by changing a liquid state to a powder state.

Thereafter, the silver particles were re-dispersed in toluene solvent to thereby produce a dispersion wherein silver particles coated with hexyl amine are dispersed. In example 2, octyl amine was used to produce silver particles covered with octyl amine, which are dispersed in toluene solvent in the same manner as in example 1.

On the other hand, silver particles dispersed in toluene solvent were obtained in comparative examples 1 and 2 using decyl amine and lauryl amine in the same manner as in example 1.

Measurement of particle distribution of the silver particles obtained in examples 1 and 2 and comparative examples 1 and 2 was conducted. The results are shown in Table 1. The four kinds of the silver particles had the particle distributions shown in Table 1 and had the organic substance carried on the surface of silver particles that have thermal decomposition characteristics shown in FIG. 1.

TABLE 1

|  | Example 1 Hexyl amine | Example 2 Octyl amine | Comparative Example 1 Decyl amine | Comparative example 2 Lauryl amine |
| --- | --- | --- | --- | --- |
| *1 | 7.6 | 7.6 | 7.6 | 18.1 |
|  | 15.2 | 15.2 | 15.2 |  |
| *2 | 0.344 | 2.75 | No peak | No peak |

*1; Particle size (nm) at peaks in a range of 100 nm or less
*2; Particle size (nm) at peaks in a range of 100 nm or more Next, shearing strength tests of bonded portions were conducted wherein a paste material dispersing the silver particles in toluene was used. Test pieces were made of copper. An upper member had a diameter of 5 mm and a thickness of 2 mm; a lower member had a diameter of 10 mm and a thickness of 5 mm. After the paste material was coated on the test pieces, drying at 60° C. for 5 minutes was conducted to remove toluene, followed by bonding. Bonging temperatures were selected as 250° C., 300° C., 350° C. and 400° C. Bonding time was 2 minutes 30 seconds. A pressure was 2.5 MPa.

Figure 2:
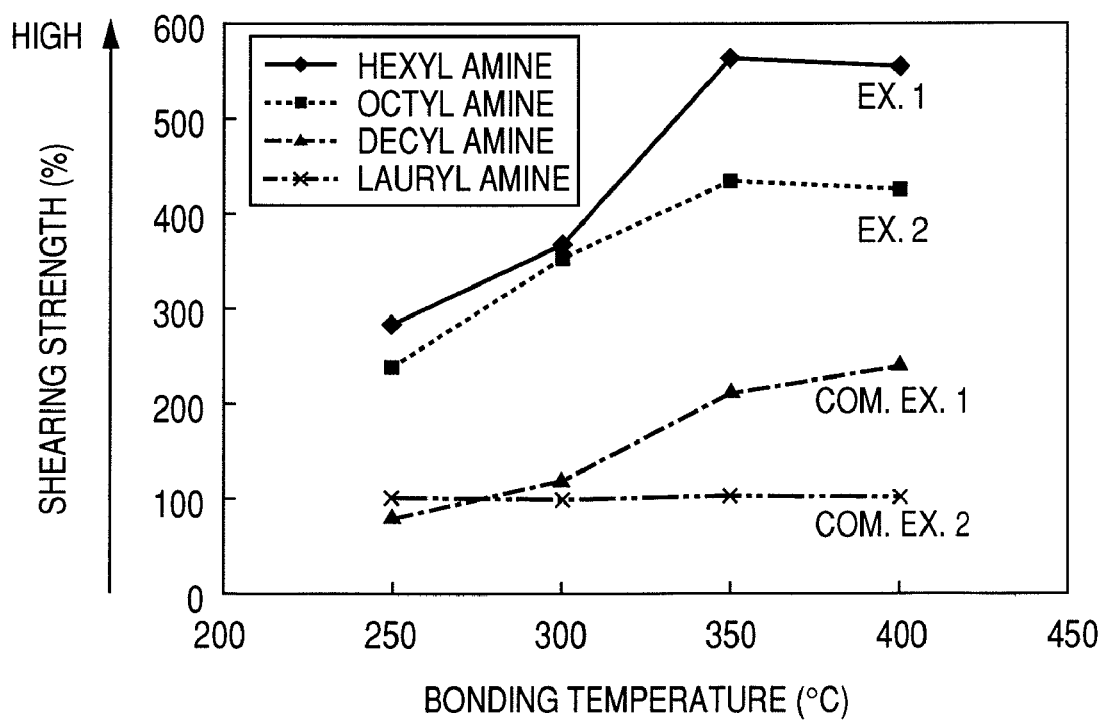
FIG. 2 shows a relationship between bonding temperatures and shearing strength.

Using the test pieces obtained in the above bonding methods, shear strength under a single shearing stress was measured. In the shearing test Bond Tester—SS-100KP (maximum load; 100 kg) manufactured by Seishin Trade Corp. was used. A shearing speed was 30 mm/min, and the test pieces were ruptured by a shearing tool to measure the maximum load at rupture. The maximum load was divided by a bonding area to obtain the sharing strength. The bonding temperatures in FIG. 2 were 250☐, 300☐, 350☐ and 400☐.

The shearing strength of the bonding portion using laurylamine for treating the silver particles of the paste was 100%, and ratios of shearing strengths of the bonding portions using decylamine, octylamine and hexylamine to the shear strength of the bonding portion using laurylamine.

Figure 3:
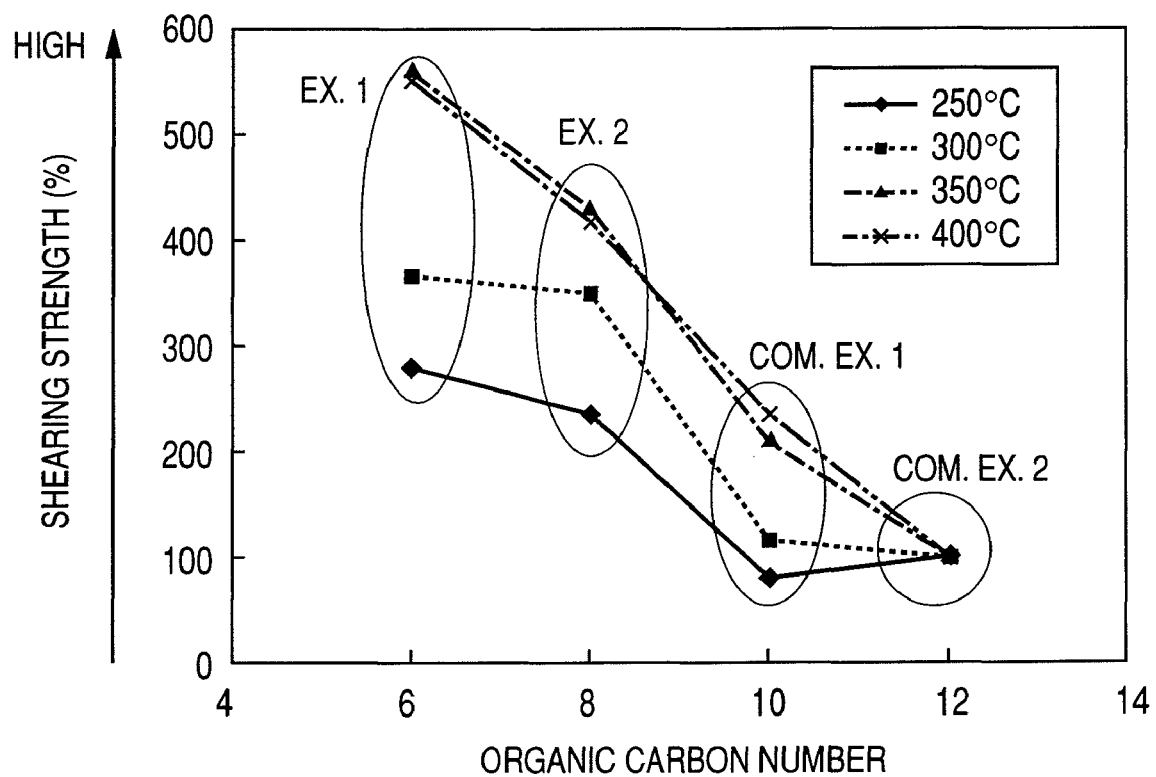
FIG. 3 shows a relationship between the number of carbon atoms in the organic substances used for coating silver particles and shearing strength.

In FIG. 3 there is shown a relationship between the number of carbon atoms in the organic substances used for coating silver particles and shearing strength. As the number of carbon atoms coated on the silver particles deceases, and the particle size distribution based on a volumetric base has a peak in a particle size of 100 nm or more, the shear strength becomes large. When the number of carbon atoms is 8 or less, and when a bonding material wherein aggregation of silver particles progresses is used, residue of the organic substance in the sintered layer decreases after bonding and the shear strength starts to increase. When the number of carbon atoms is 6, sufficient sintering progresses to produce a strong bonding.

Example 3

Figure 4A:
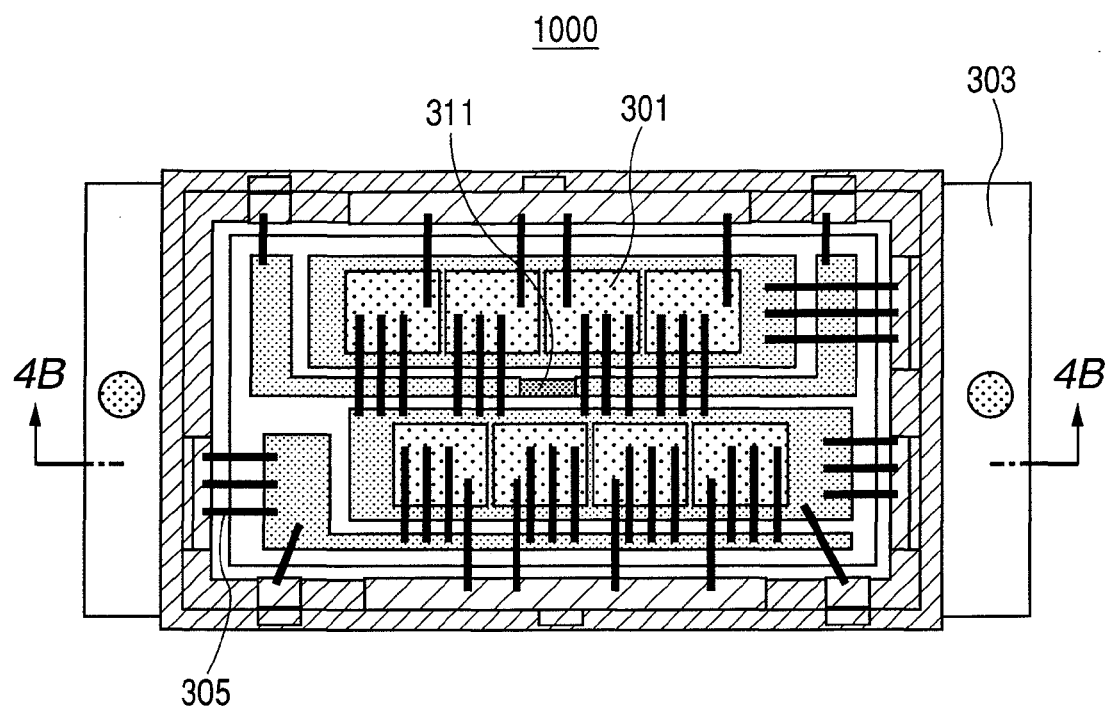
FIG. 4 shows a structure of a non-insulated type semiconductor device according to an embodiment of the present invention, wherein FIG. 4(a) a plan view of the device
FIG. 4(b) is a cross sectional view along line A-A' in FIG. 4(a)
Figure 4B:
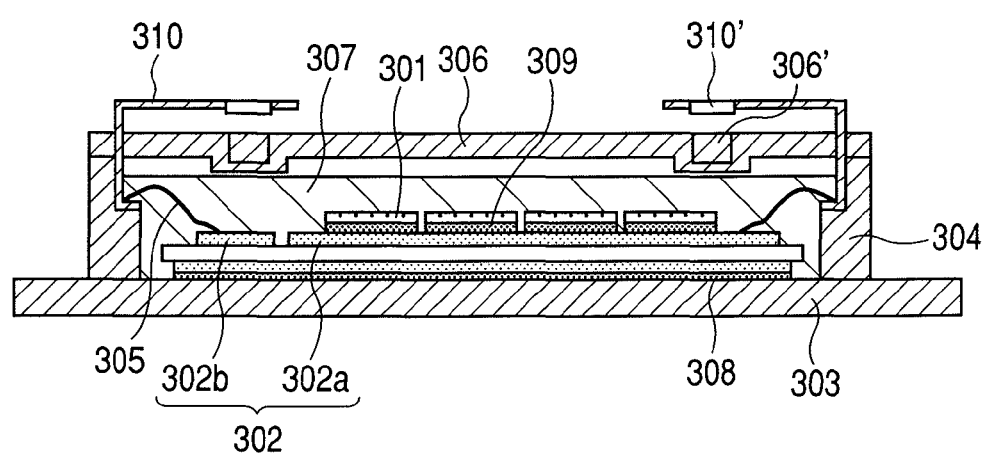

FIG. 4 shows s structure of a non-insulated type semiconductor device according to an embodiment of the present invention, wherein FIG. 4(a) a plan view of the device and FIG. 4(b) is a cross sectional view along line A-A' in FIG. 4(a).

After the semiconductor (MOSFET) 301 is mounted on ceramic insulating substrate 302, which is mounted on base 301, epoxy resin case 304, bonding wire 305 and epoxy resin cover 306 were arranged. Silicone gel 307 was filled in the case 304. The ceramic insulating substrate 302 on the base 303 was bonded with a bonding layer 308 formed by the paste of example 1. The paste comprises silver particles having the particle size of 100 μm or less, which were coated with hexylamine, and have peaks at 7.6 nm and 15.2 nm when the volumetric base particle distribution is 100 nm or less, and at 0.3437 μm when the volumetric base particle distribution is 100 nm or more. The silver particles were dispersed in toluene in a concentration of 80% by weight to form the bonding layer 308.

8 of Si MOSFETs were bonded by the bonding layer 309 formed from the above-mentioned paste on copper plate 302a of the ceramic insulating substrate 302. Bonding was carried out by the bonding layers 308, 309 formed from the above-mentioned paste, wherein the paste was coated on the copper plate 302a (Ni plated) on the ceramic insulating substrate 302, and was coated on the base material 303.

The semiconductor elements 301 and the ceramic insulating substrate 302 were placed on the coated paste. The bonding portions were heated at 300° C. for 5 minutes under a pressure of 0.5 MPa.

Electrodes 302b formed on the insulating substrate and terminals 310 formed to the epoxy resin case 304 were connected by aluminum bonding wire having a diameter of 300 μm, bonded by ultrasonic bonding. A thermistor element 311 for detecting temperature has a bonding layer 309 formed from the paste. Electrode 302 and terminal 310 are connected by aluminum bonding wire 305 having a diameter of 300 μm to be connected to outside.

The epoxy resin case 304 and the base material 303 were fixed with silicone resin adhesive (not shown). The thick portion of the epoxy resin cover 306 has a cavity 306', and the terminal 310 has a hole 310'; a screw (not shown) for connecting the insulated type semiconductor device 1000 to an outer circuit can be disposed. The terminal 310 was punched into a desired shape in advance. The shaped copper plate was Ni plated, which was fixed to the epoxy resin case 304.

Figure 5:
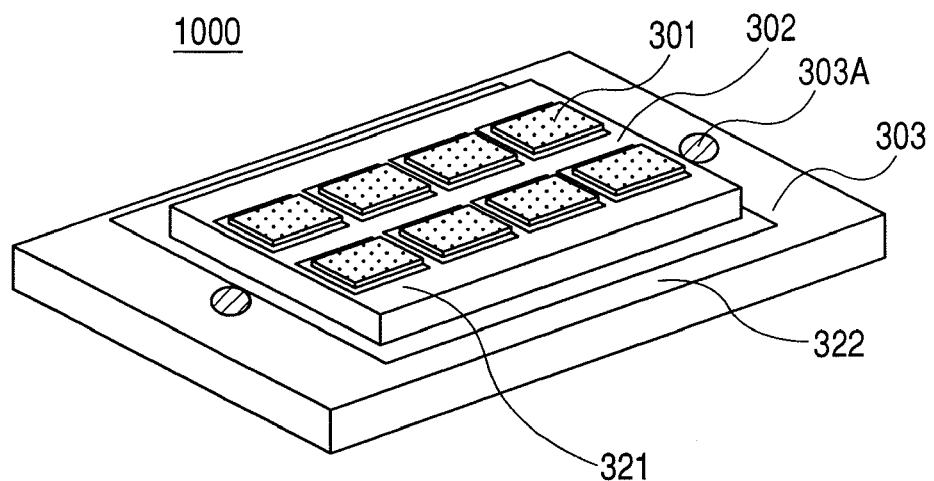
FIG. 5 shows a sub-assembly of the insulated type semiconductor device shown in FIG. 4.

FIG. 5 shows a sub-assembly of the insulated type semiconductor device shown in FIG. 4, wherein the ceramic substrate and the semiconductor element were mounted on the base material 303 as a composite material. The base material 303 is provided with fixing holes 303A in the periphery of thereof. The base material is formed of copper, the surface of which is plated with Ni.

The base material 303 was coated with the paste used in example 1. The paste comprises silver particles coated with hexylamine; the silver particles having the particle size of 100 nm or less have particle size distribution peaks at 7.6 nm and 15.2 nm and in a particle size of 100 nm or more the silver particles have a peak of the particle size distribution at 0.344 μm. The silver particles having the above particle distribution peaks were dispersed in toluene at a concentration of 80% by weight. MOSFET 301 was mounted on the ceramic insulating substrate 302 by the paste.

Figure 6:
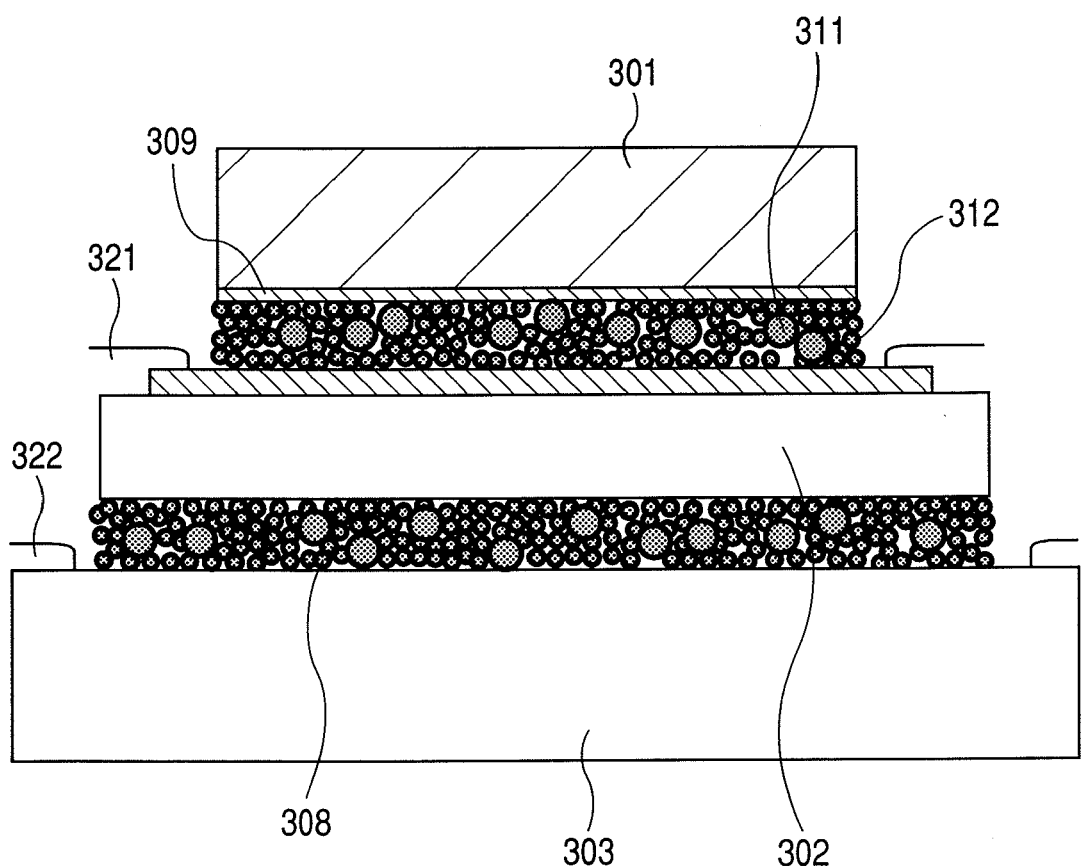
FIG. 6 shows a cross sectional view of a sub-assembly of the insulated type semiconductor device shown in FIG. 5, before bonding.

FIG. 6 shows a cross sectional view of a sub-assembly 1000 of the insulated type semiconductor device shown in FIG. 5, before bonding. As shown in FIG. 6, it is possible to use the paste material in which the bonding material in example 1 is dispersed in toluene in a concentration of 80% by weight. For preventing flowing out of the paste at the time of coating, a water repellent film 322 was formed in correspondence to the mounting area of the ceramic insulating substrate 302 on the base material 303.

Experiment 4

Figure 7:
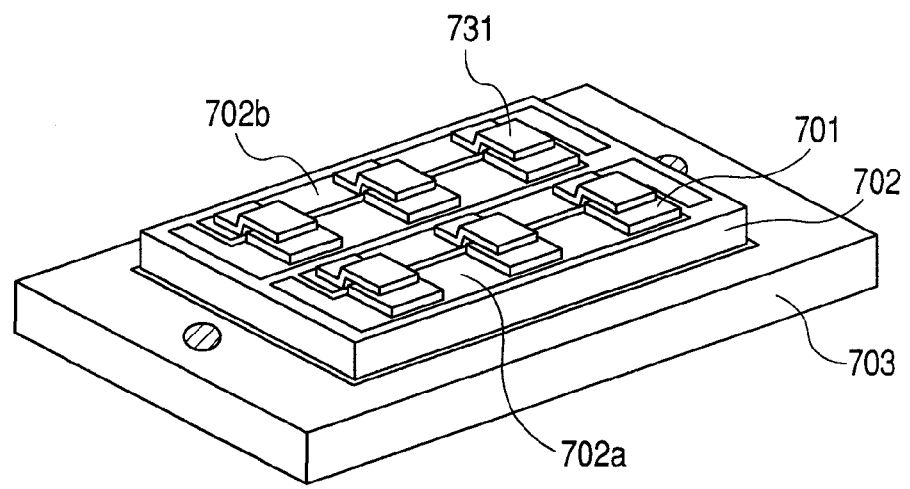
FIG. 7 shows a perspective view of a non-insulated type semiconductor device according to another embodiment.

FIG. 7 shows a perspective view of a non-insulated type semiconductor device according to another embodiment.

The semiconductor element 701 and ceramic insulating substrate 703 were bonded by the paste used in example 1 wherein the paste comprises silver particles coated with hexylamine; the silver particles having the particle size of 100 nm or less have particle size distribution peaks at 7.6 nm and 15.2 nm and in a particle size of 100 nm or more the silver particles have a peak of the particle size distribution at 2.75 μm. The silver particles having the above particle distribution peaks were dispersed in toluene at a concentration of 80% by weight.

The emitter electrode of the semiconductor element and the copper wiring plated with nickel, formed on the ceramic insulating substrate, were bonded by the paste.

Figure 8:
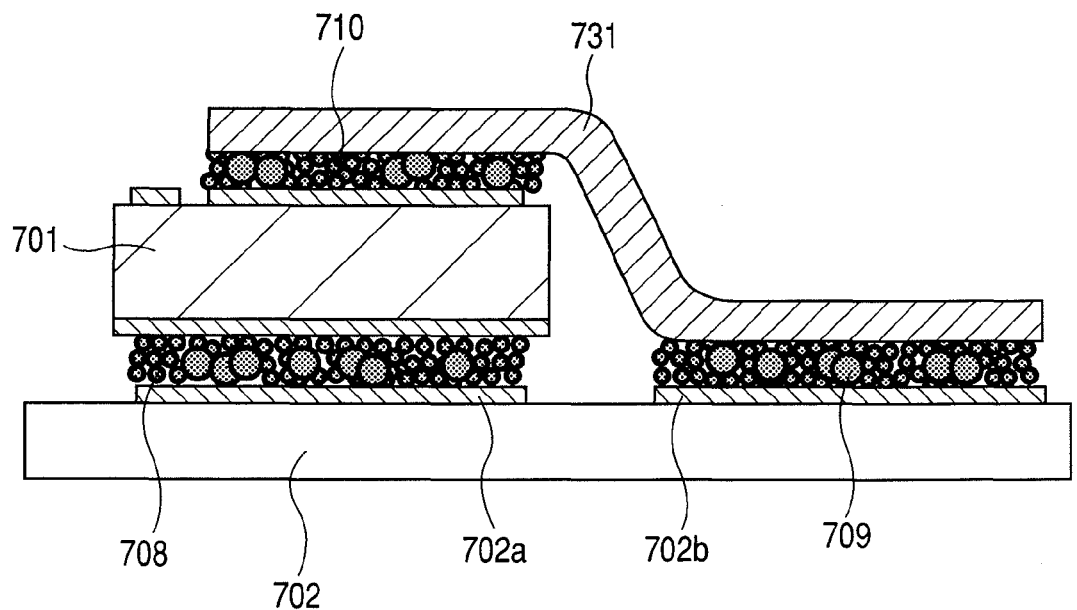
FIG. 8 shows a cross sectional view of the semiconductor device shown in FIG. 7, before bonding.

FIG. 8 shows a cross sectional view of the semiconductor device shown in FIG. 7, before bonding. Connecting terminal 731 was copper plate plated with nickel and gold on nickel plating. After mounting the semiconductor element 701 on the wiring 702a of the insulating substrate, the paste material (710) was coated on the emitter electrode (upper side). Then, a gold plated portion of the copper wiring 702b formed on the insulating substrate 702 the surface of which was nickel-plated and a portion between the emitter electrode and the terminal 731 were coated with the paste (709). The connecting terminal 731 was placed on electrode above the paste material and bonding between the semiconductor 701 and the insulating substrate 702b was conducted at 250° C. under a pressure of 1.0 MPa for 5 minutes. In the insulated type semiconductor device, since large current flows through not only the collector electrode, but also the emitter electrode, it is possible to increase bonding reliability at the emitter electrode side by using a connecting terminal 731 having a large wiring width.

Example 5

Figure 9A:
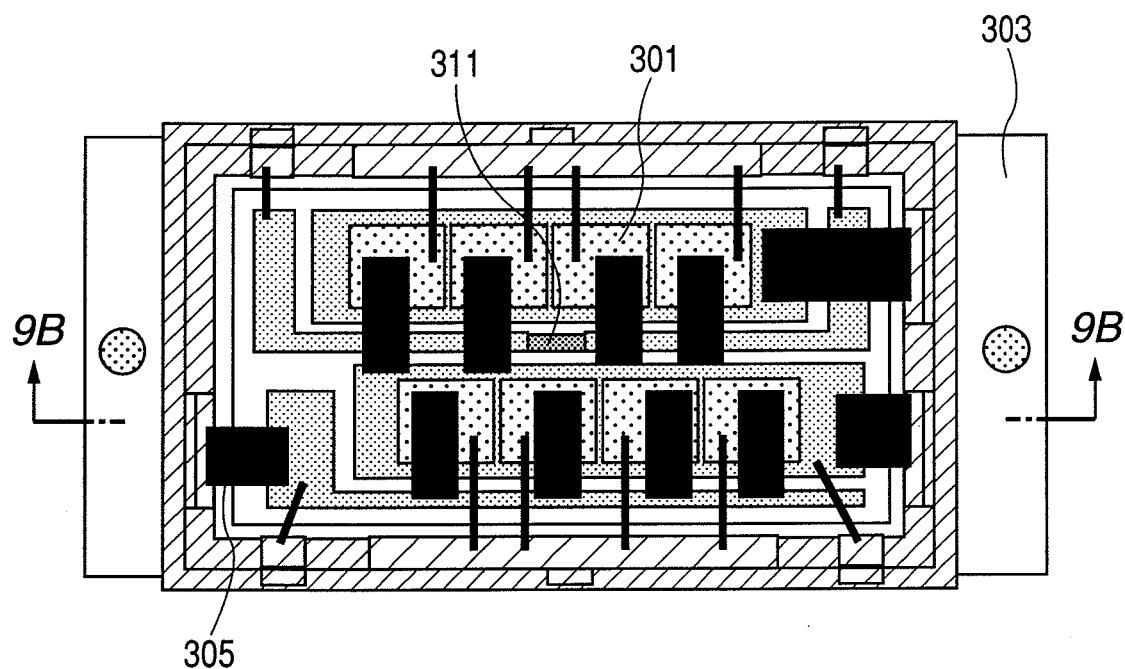
FIG. 9(a) is a plan view of the semiconductor device and FIG. 9(b) is a cross sectional view of the semiconductor device shown in FIG. 9(a)
Figure 9B:
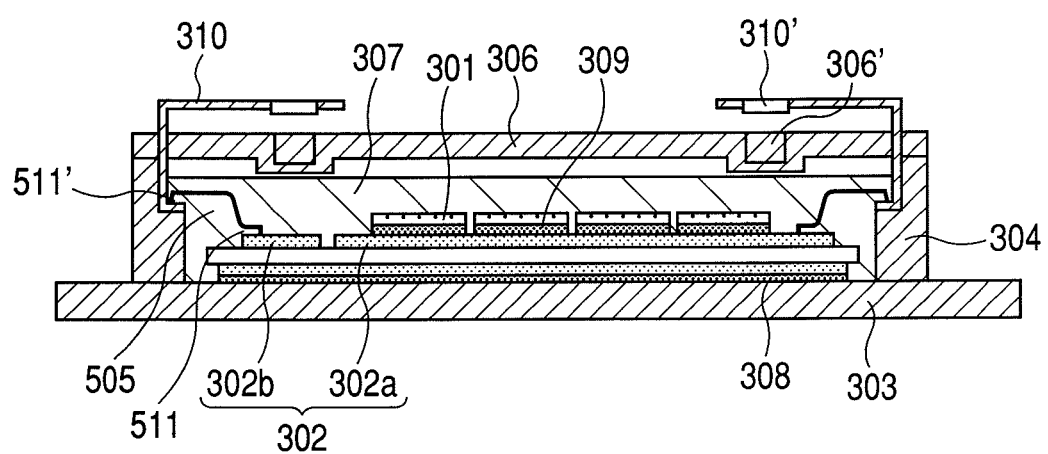

FIG. 9 shows an embodiment of a non-insulated type semiconductor device similar to that of example 3. FIG. 9(a) is a plan view of the semiconductor device and FIG. 9(b) is a cross sectional view of the semiconductor device shown in FIG. 9(a). In this example, a connecting terminal 505 was used instead of the bonding wire in example 3.

The electrodes 302a, 302b on the insulating substrate and terminal 310 formed on epoxy resin casing 304 were bonded by using a paste used in example 1. The paste was coated on the electrodes. The bonding was conducted by heating at 250° C. for 2 minutes under a pressure of about 0.5 MPa towards the clip 505.

The paste comprises silver particles coated with hexylamine; the silver particles having the particle size of 100 nm or less have particle size distribution peaks at 7.6 nm and 15.2 nm and in a particle size of 100 nm or more the silver particles have a peak of the particle size distribution at 2.75 μm. The silver particles having the above particle distribution peaks were dispersed in toluene at a concentration of 80% by weight.

Example 6

In this example there is explained an insulated type semiconductor device for a high frequency amplification apparatus used in a transmitter of cellular telephones, etc.

Figure 10:
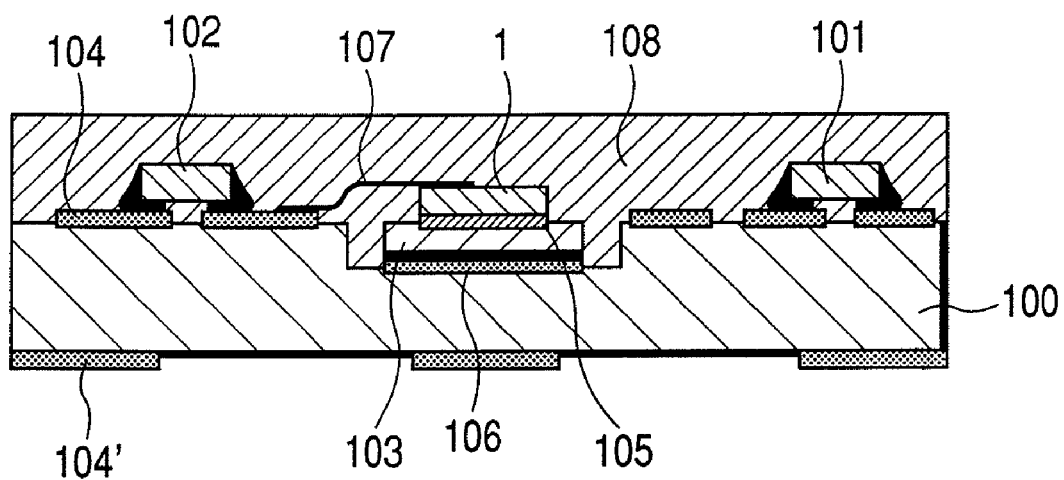
FIG. 10 shows a cross sectional view of the insulated type semiconductor device.

The insulated type semiconductor device (size: 10.5 mm×4 mm×1.3 mm) in this example has a following constitution. FIG. 10 shows a cross sectional view of the insulated type semiconductor de vice. MOSFET element 1 (size: 2.4 mm×1.8 mm×0.24 mm), chip resistor 101 (temperature coefficient about 7 ppm/° C.) and chip condenser 102 (temperature coefficient about 11.5 ppm/° C.) were mounted on a multi-glass ceramic substrate 100 as a substrate (size: 10.5 mm×4 mm×0.5 mm; three layered wiring; thermal expansion coefficient 6.2 ppm; thermal conductivity 2.5 W/m·K; bending strength 0.25 Gpa; Young's modulus 110 Gpa; specific dielectric constant 5.6 (at 1 MHz)).

An intermediate metal member 103 such as Cu—Cu2O composite material is disposed between MOSFET element 1 and the multi-layered glass ceramic substrate 100. There are formed inside of the multi-layered glass ceramic substrate 100 a thick film inner wiring layer (Ag-1 wt % Pt, diameter 140 μm), a thick film through-hole conductor for electric connection between the multi-layered wirings (Ag-1 wt % Pt, diameter 140 μm) and a thermal via hole for heat dissipation (Ag-1 wt % Pt, diameter 140 μm).

A thick film wiring pattern 104 (Ag-1 wt % Pt, thickness 15 μm) was formed on one of the main faces of the multi-layered glass ceramic substrate 100. Chip components including the chip resistor 101 and chip condenser 102 were coated with the paste used in example 2. The paste comprises silver particles coated with hexylamine; the silver particles having the particle size of 100 nm or less have particle size distribution peaks at 7.6 nm and 15.2 nm and in a particle size of 100 nm or more the silver particles have a peak of the particle size distribution at 2.75 μm. The silver particles having the above particle distribution peaks were dispersed in toluene at a concentration of 80% by weight. The paste was coated on the thick film pattern, followed by bonding at 300° C. for 5 minutes under a pressure of 0.5 MPa towards the chip components. As a result, the wiring pattern and the chip components were electrically connected by sintered silver layer 105.

MOSFET 1 (Si, temperature constant 3.5 ppm/° C.) was mounted In the cavity formed in one main face of the multi-layered glass ceramic substrate 100 by means of an intermediate member 103. Bonding was conducted in a vacuum of $10^{-3}$. The size of the intermediate member 103 was 2.8 mm×2.2 mm×0.2 mm. The sintered silver layer 105 for connecting MOSFET 1 and the intermediate metal member 103 and the bonding layer 106 for connecting the intermediate metal member 103 and the multi-layered glass ceramic substrate are formed by using the paste in example 2 wherein the bonding materials are dispersed in toluene in the concentration of 80% by weight.

The clip type connecting terminal 107 made of copper is bonded between MOSFET 1 and the thick film wiring pattern 104. The clip was pressed at 0.1 MPa at 300° C. for 2 minutes.

A thick film exterior electrode 104' (Ag-1 wt % Pt, thickness; 15 μm) was formed on the other main face of the multi-layered glass ceramic substrate 100. The thick film exterior electrode 104' is electrically connected to the thick film through the inner wiring layer disposed in the ceramic substrate 100 or through-hole wiring. The epoxy resin layer 108 is formed on the other main face of the multi-layered glass ceramic substrate 100 to seal the mounted chip components.

Example 7

In this example non-insulated type semiconductor device to which lead frame for a mini-molded type transistor was used is explained.

Figure 11:
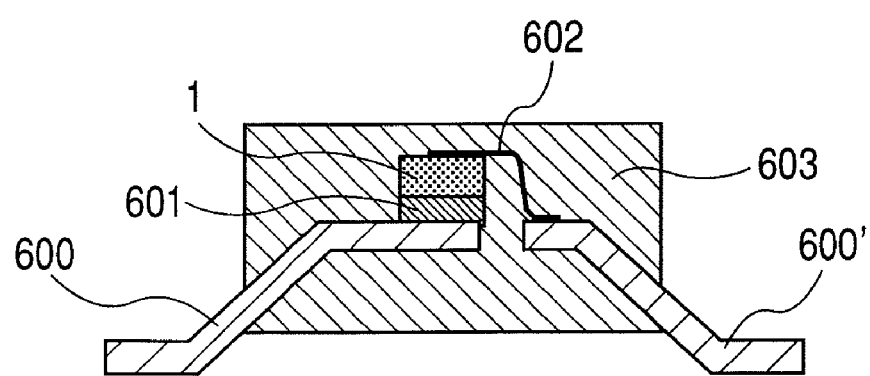
FIG. 11 shows a cross sectional view of the mini-molded type non-insulated semiconductor device according to an example.

FIG. 11 shows a cross sectional view of the mini-molded type non-insulated semiconductor device according to this example.

Silicon transistor element 1 (size; 1 mm×1 mm×0.3 mm) as a semiconductor element was bonded to the lead frame 600 (thickness 0.3 mm) made of Cu—Cu$_2$O composite material by a sintered silver layer 601 formed from the paste. The paste comprises silver particles coated with hexylamine; the silver particles having the particle size of 100 nm or less have particle size distribution peaks at 7.6 nm and 15.2 nm and in a particle size of 100 nm or more the silver particles have a peak of the particle size distribution at 2.75 μm. The silver particles having the above particle distribution peaks were dispersed in toluene at a concentration of 80% by weight.

A collector of the transistor element 1 was placed at the bonding side. The emitter and the base electrode were disposed at the opposite side of the bonding side. The paste was coated on the portion between the clip terminal 602 and lead frame 600, and the bonding was conducted at 250° C. for 2 minutes under a pressure of 1.0 MPa towards the clip terminal. The main portion of the semiconductor device including the transistor element 1 and the clip terminal 602 was molded with epoxy resin 603 by transfer molding. The tips of the lead frame 600 are separated from the lead terminals after the molding with epoxy resin is finished.

Example 8

LED was packaged on a substrate using the bonding material according to the present invention. Better heat dissipation is expected than those of the conventional solder bonding or thermal conductive adhesives.

What is claimed is:

1. A bonding material comprising metal particles, which are coated with an organic substance having carbon atoms of 2 to 8, wherein the metal particles comprise a first portion having a particle size of 100 nm or less, and a second portion having a particle size larger than 100 nm but not larger than 100 μm, each of the portions having at least one peak of a particle distribution, based on a volumetric base.

2. The bonding material according to claim 1, wherein the metal particles are at least one member selected from the group consisting of gold, silver and copper.

3. The bonding material according to claim 1, wherein the organic substance contains oxygen atoms, nitrogen atoms and/or sulfur atoms.

4. The bonding material according to claim 1, wherein the organic substance is at least one organic compounds having a radical selected from the group consisting of an alcohol group, amino group, carboxyl group, carbonyl group, aldehyde group and sulfanyl group.

5. The bonding material according to claim 1, wherein a weight ratio of the first portion in the total metal particles is larger than 0.001, but smaller than 100.

6. The bonding material according to claim 1, wherein the metal particles are dispersed in an organic solvent.

7. The bonding material according to claim 1, wherein the organic substance is a member selected from the group consisting of alkyl amines, alkyl carboxylic acids, alkyl alcohols and suphanyl compounds.

8. A bonding material comprising metal particles having an average particle size of 1 nm to 100 nm as a first portion, and aggregated particles having a particle size of 10 nm to 100 μm as a second portion, wherein the aggregated particles are an aggregate of the metal particles, and wherein each of the first portion and the second portion has at least one peak of a particle distribution on a volumetric base.

9. The bonding material according to claim 8, wherein the metal particles and the aggregated particles are coated with an organic substance having carbon atoms of 2 to 8.

10. The bonding material according to claim 9, wherein the organic substance is at least one organic compounds having a radical selected from the group consisting of an alcohol group, amino group, carboxyl group, carbonyl group, aldehyde group and sulfanyl group.

11. The bonding material according to claim 8, wherein the metal particles and aggregated particles are at least one member selected from the group consisting of gold, silver and copper.

12. The bonding material according to claim 8, wherein a weight ratio of the metal particles in the total amount of the metal particles and the aggregated particles is larger than 0.001, but smaller than 100.

13. The bonding material according to claim 8, wherein the metal particles and the aggregated particles are dispersed in an organic solvent.

14. The bonding material according to claim 8, wherein the organic substance is a member selected from the group consisting of alkyl amines, alkyl carboxylic acids, alkyl alcohols and sulphanyl compounds.

15. A bonding material comprising metal particles, which are coated with an organic substance having carbon atoms of 2 to 8, wherein the metal particles comprise a first portion having a mean particle size of 100 nm or less and a second portion having a mean particle size of 10 nm to 100 μm, each of the first and second portions having at least one peak of particle distribution, based on a volumetric base, and wherein the second portion is composed of the metal particles aggregated from the metal particles of the first portion, the metal particles in the second portion being covered with the organic substance.

16. The bonding material according to claim 15, wherein the organic substance has a radical selected from the group consisting of amino group, alcohol group, carboxyl group, sulphanyl group, carbonyl group, aldehyde group and ester group.

17. The bonding material according to claim 15, wherein the metal particles are dispersed in an organic solvent.

18. The bonding material according to claim 17, wherein the organic substance is a member selected from the group consisting of alkyl amines, alkyl carboxylic acids, alkyl alcohols and sulphanyl compounds.

19. The bonding material according to claim 15, wherein the organic substance on the metal particles in the second portion has been removed.

20. The bonding material according to claim 15, wherein the metal particles in the first portion have a mean particle size of 1 nm to 100 nm, and the metal particles in the second portion have a mean particle size of 100 nm to 100 μm.

21. The bonding material according to claim 15, wherein the metal particles coated with the organic substance are suspending in an organic solvent.

22. The bonding material according to claim 15, wherein the organic substance is a member selected from the group consisting of alkyl amines, alkyl carboxylic acids, alkyl alcohols and sulphanyl compounds.

* * * * *